US009401362B2

(12) United States Patent
Zang

(10) Patent No.: US 9,401,362 B2
(45) Date of Patent: Jul. 26, 2016

(54) MULTIPLE THRESHOLD VOLTAGE SEMICONDUCTOR DEVICE

(71) Applicant: GLOBALFOUNDRIES Inc., Grand Cayman (KY)

(72) Inventor: Hui Zang, Guilderland, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 74 days.

(21) Appl. No.: 14/245,656

(22) Filed: Apr. 4, 2014

(65) Prior Publication Data

US 2015/0287725 A1 Oct. 8, 2015

(51) Int. Cl.
H01L 27/092 (2006.01)
H01L 21/8234 (2006.01)
H01L 21/8238 (2006.01)
H01L 27/088 (2006.01)

(52) U.S. Cl.
CPC ...... *H01L 27/0922* (2013.01); *H01L 21/82345* (2013.01); *H01L 21/823412* (2013.01); *H01L 21/823842* (2013.01); *H01L 27/092* (2013.01); *H01L 21/823456* (2013.01); *H01L 27/088* (2013.01)

(58) Field of Classification Search
CPC .................................. H01L 21/82345
See application file for complete search history.

(56) References Cited

U.S. PATENT DOCUMENTS

| 6,448,590 | B1 | 9/2002 | Adkisson et al. |
| 6,797,553 | B2 | 9/2004 | Adkisson et al. |
| 8,252,649 | B2 | 8/2012 | Stahrenberg et al. |
| 8,357,581 | B2 | 1/2013 | Masuoka et al. |
| 8,445,344 | B2 | 5/2013 | Carter et al. |
| 2002/0106858 | A1* | 8/2002 | Zheng ............. H01L 21/823425 438/258 |
| 2006/0105527 | A1* | 5/2006 | Saito ............... H01L 21/823443 438/275 |
| 2010/0001348 | A1 | 1/2010 | Mitsuhashi et al. |
| 2010/0006945 | A1 | 1/2010 | Merelle et al. |
| 2013/0049134 | A1 | 2/2013 | Sunamura |
| 2013/0241003 | A1 | 9/2013 | Lin et al. |
| 2013/0299914 | A1 | 11/2013 | Kim |
| 2014/0061814 | A1 | 3/2014 | Kim et al. |
| 2014/0203243 | A1 | 7/2014 | Xiao |

FOREIGN PATENT DOCUMENTS

WO WO 2009/053251 A1 4/2009

OTHER PUBLICATIONS

Jun. 15, 2015 Office Action in U.S. Appl. No. 14/188,898.
Mar. 18, 2015 Restriction Requirement in U.S. Appl. No. 14/188,778.
Jun. 1, 2015 Office Action in U.S. Appl. No. 14/188,778.

(Continued)

*Primary Examiner* — Daniel Luke
(74) *Attorney, Agent, or Firm* — Heslin Rothenberg Farley & Mesiti P.C.; Kristian Ziegler; Nicholas Mesiti

(57) ABSTRACT

In one aspect there is set forth herein a semiconductor device having a first field effect transistor formed in a substrate structure, a second field effect transistor formed in the substrate structure, and a third field effect transistor formed in the substrate structure. The first field effect transistor can include a first gate stack configuration, and a first threshold voltage. The second field effect transistor can include a second gate stack configuration, and a second threshold voltage. The third field effect transistor can include a third gate stack configuration, and a third threshold voltage.

12 Claims, 12 Drawing Sheets

(56) References Cited

OTHER PUBLICATIONS

May 12, 2015 Restriction Requirement in U.S. Appl. No. 14/189,085.
Joshi et al., "Integrated Circuits With Varying Gate Structures and Fabrication Methods", U.S. Appl. No. 14/188,778, filed Feb. 25, 2014, 38 pages.
Joshi et al., "Integration Method for Fabrication of Metal Gate Based Multiple Threshold Voltage Devices and Circuits", U.S. Appl. No. 14/188,898, filed Feb. 25, 2014, 58 pages.
Lee et al., "Integrated Circuit Having Multiple Threshold Voltages", U.S. Appl. No. 14/189,085, filed Feb. 25, 2014, 57 pages.

* cited by examiner

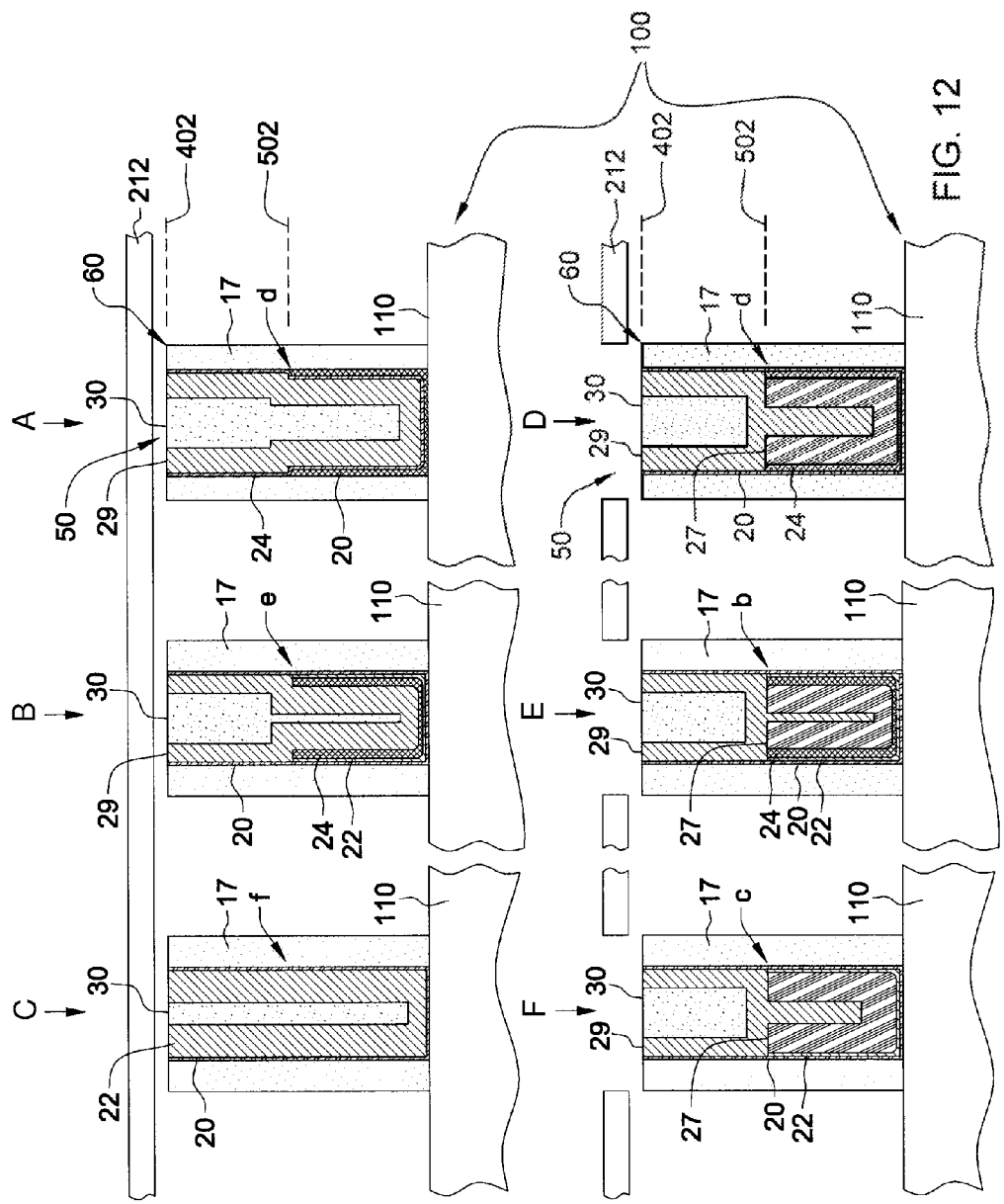

US 9,401,362 B2

MULTIPLE THRESHOLD VOLTAGE SEMICONDUCTOR DEVICE

FIELD OF THE INVENTION

The present invention relates to semiconductor devices, and more particularly, to multiple threshold voltage semiconductor devices.

BACKGROUND OF THE INVENTION

Different semiconductor devices may be fabricated to have one or more different device characteristics, such as switching speed, leakage power consumption, etc. Multiple different designs may each provide optimization of one or more of these characteristics for devices intended to perform specific functions. For instance, one design may increase switching speed for devices providing computational logic functions, and another design may decrease power consumption for devices providing memory storage functions. A system using multiple discrete devices optimized for different functions presents challenges in terms of system complexity, system footprint and cost.

BRIEF DESCRIPTION

In one aspect there is set forth herein a semiconductor device having a first field effect transistor formed in a substrate structure, a second field effect transistor formed in the substrate structure, and a third field effect transistor formed in the substrate structure. The first field effect transistor can include a first gate stack configuration, and a first threshold voltage. The second field effect transistor can include a second gate stack configuration, and a second threshold voltage. The third field effect transistor can include a third gate stack configuration, and a third threshold voltage.

BRIEF DESCRIPTION OF THE SEVERAL VIEWS OF THE DRAWINGS

One or more aspects as set forth herein are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 12 is a cross sectional gate lengthwise side view according to one embodiment taken along lines A-A and lines B-B of FIG. 3.

DETAILED DESCRIPTION

In one aspect there is set forth herein a semiconductor device having a first field effect transistor formed in a substrate structure, a second field effect transistor formed in the substrate structure, and a third field effect transistor formed in the substrate structure. The first field effect transistor can include a first gate stack configuration, and a first threshold voltage. The second field effect transistor can include a second gate stack configuration, and a second threshold voltage. The third field effect transistor can include a third gate stack configuration, and a third threshold voltage.

Figure 1:
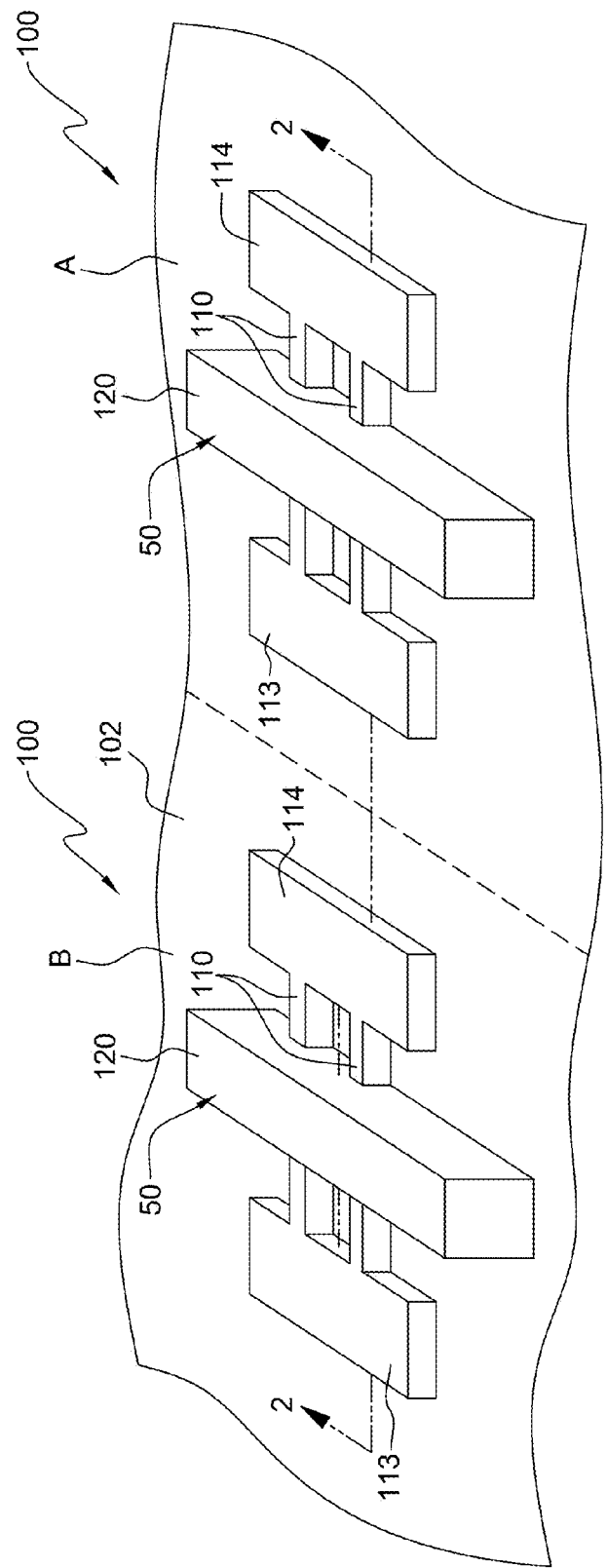
FIG. 1 is a perspective view of a semiconductor device having a first field effect transistor including a first gate stack configuration, and a second field effect transistor including a second gate stack configuration.
Figure 2:
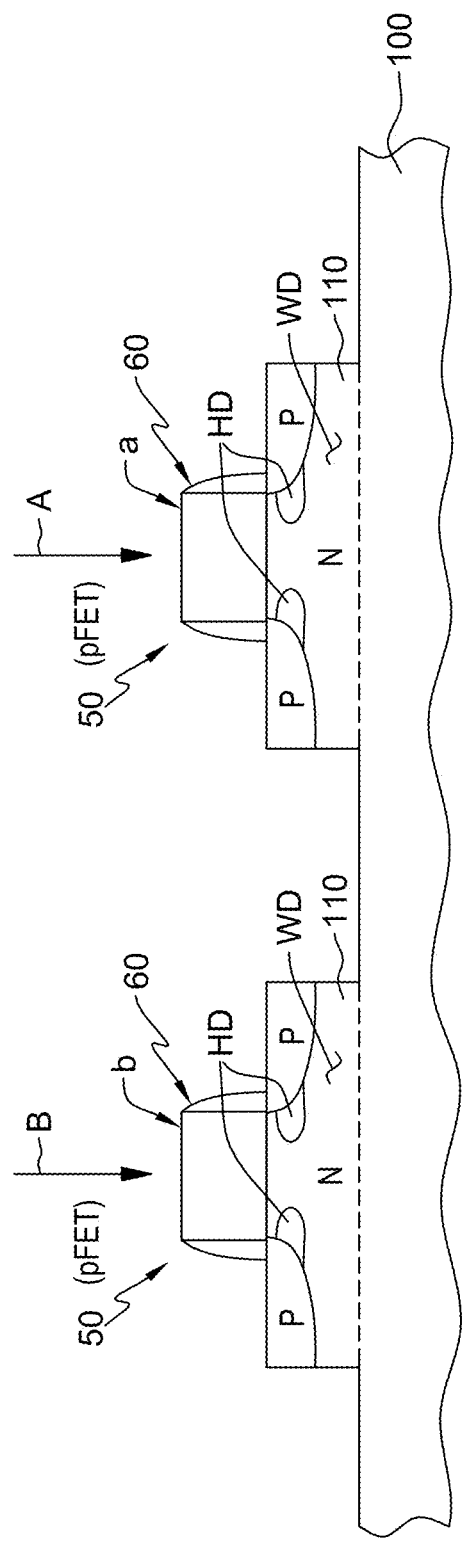
FIG. 2 is a cross sectional channel lengthwise side view taken along lines 2-2 of FIG. 1.

In one aspect as set forth in FIGS. 1 and 2 there is set forth herein a semiconductor device 100 having a first field effect transistor 50 formed in a substrate structure, and a second field effect transistor 50 formed in the substrate structure. The first field effect transistor 50 formed in region A of a substrate structure can include a gate 60 having a first gate stack configuration, and a first threshold voltage. The second field effect transistor 50 formed in region B of a substrate structure can include a gate 60 having a second gate stack configuration different from the first gate stack configuration, and a second threshold voltage different from the first threshold voltage. Each field effect transistor 50 can include a well doping configuration WD and a halos doping configuration HD. A semiconductor device 100 as referred to herein can include, e.g. a FET formed in a substrate structure, a component of a FET formed in a substrate structure, a plurality of FETs formed in a substrate structure, a semiconductor device 100 having a plurality of FETs formed in a substrate structure or a semiconductor wafer 1000 having a plurality of FETs formed in a substrate structure.

Semiconductor device 100 can be configured in one aspect so that a threshold voltage of field effect transistors 50 (FETs) of semiconductor device 100 can be tuned using gate stack configuration differentiation. Threshold voltage tuning using gate stack configuration differentiation can be performed using gate stack configuration differentiation without differentiation of one or more other fabrication parameter or with differentiation of one or more other fabrication parameter.

The work function of a material is an electrical property of a conductor that describes the minimum energy required to remove an electron from the material. A work function layer of a gate structure, therefore, is a material layer that directly impacts the threshold voltage because it influences the amount of energy required for electrons to flow from the gate stack configuration to a gate contact, and thereby influences the amount of energy available to attract charge carriers in a channel underlying the gate. In the development of apparatus and methods herein it was determined that providing different gate stack configurations can be useful in defining different threshold voltages.

Figure 3:
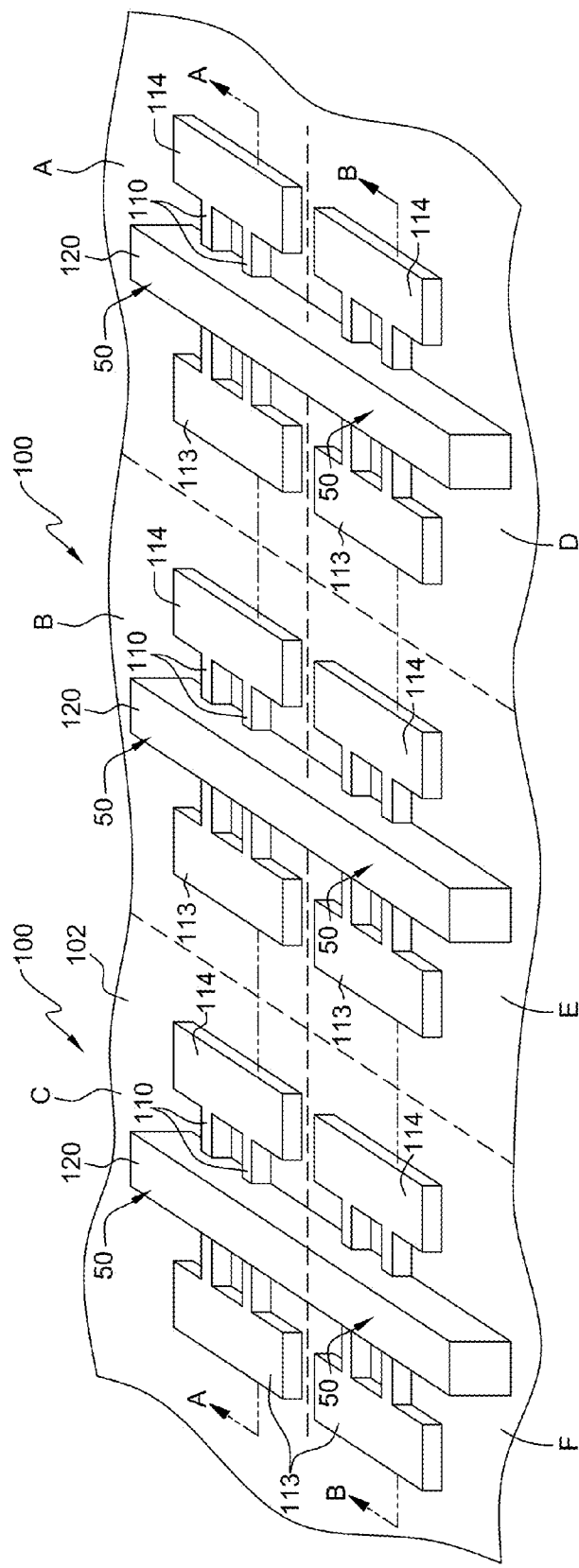
FIG. 3 is a perspective view of a semiconductor device having first through sixth field effect transistors including first through sixth gate stack configurations.
Figure 4:
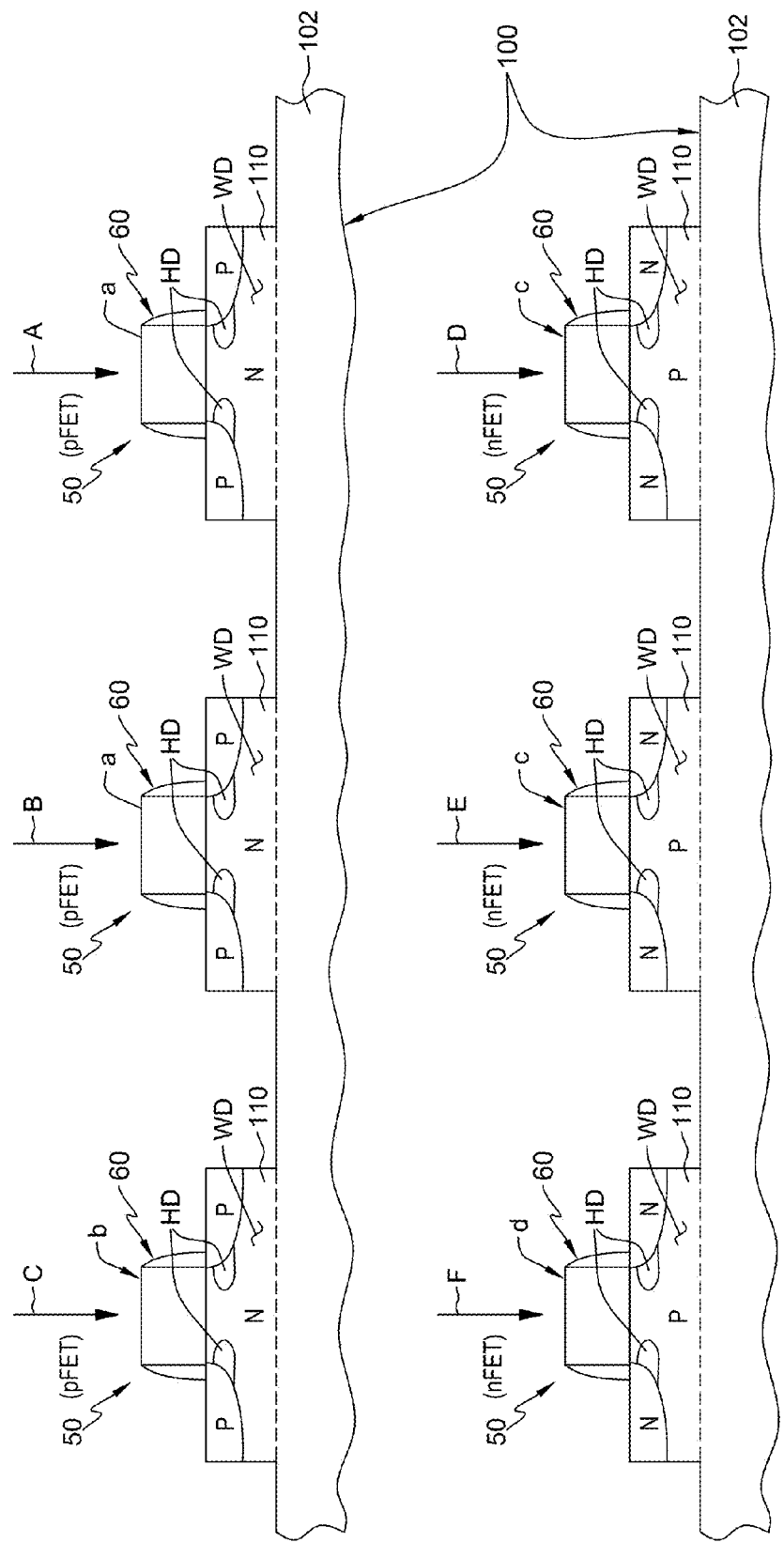
FIG. 4 is a cross sectional gate lengthwise side view taken along lines A-A and lines B-B of FIG. 3.

In one embodiment, field effect transistors 50 of a semiconductor device can have N gate stack configurations, where N is an integer value equal to greater than one. In the embodiment of FIGS. 3 and 4, semiconductor device 100 includes gates 120 having first through sixth gate stack configurations. Gate stack configurations a b and c as set forth in FIGS. 3 and 4 can be gate stack configurations of pFET FETs 50. Gate stack configurations a b c as set forth in FIGS. 3 and 4 can be gate stack configurations of nFET FETs 50. Each field effect transistor 50 can include a well doping configuration WD and a halos doping configuration HD. Referring to FIGS. 1-4, FETs 50 are shown as being formed as FinFET FETs formed in a substrate structure that includes a silicon substrate 102 and fins 104 extending contiguously from substrate 102. In another embodiment, FETs 50 can be formed in bulk silicon.

A fabrication method for fabricating a semiconductor device 100 is set forth in reference to FIGS. 5-12. While a method for fabrication of six differentiated gate stack configurations a b c de f as set forth herein is provided it is understood that the method can be scaled up so that additional gate stack configurations are provided, or scaled down so that fewer, e.g., N=1 to 5 gate stack configurations are provided, on a semiconductor device 100.

Figure 5:
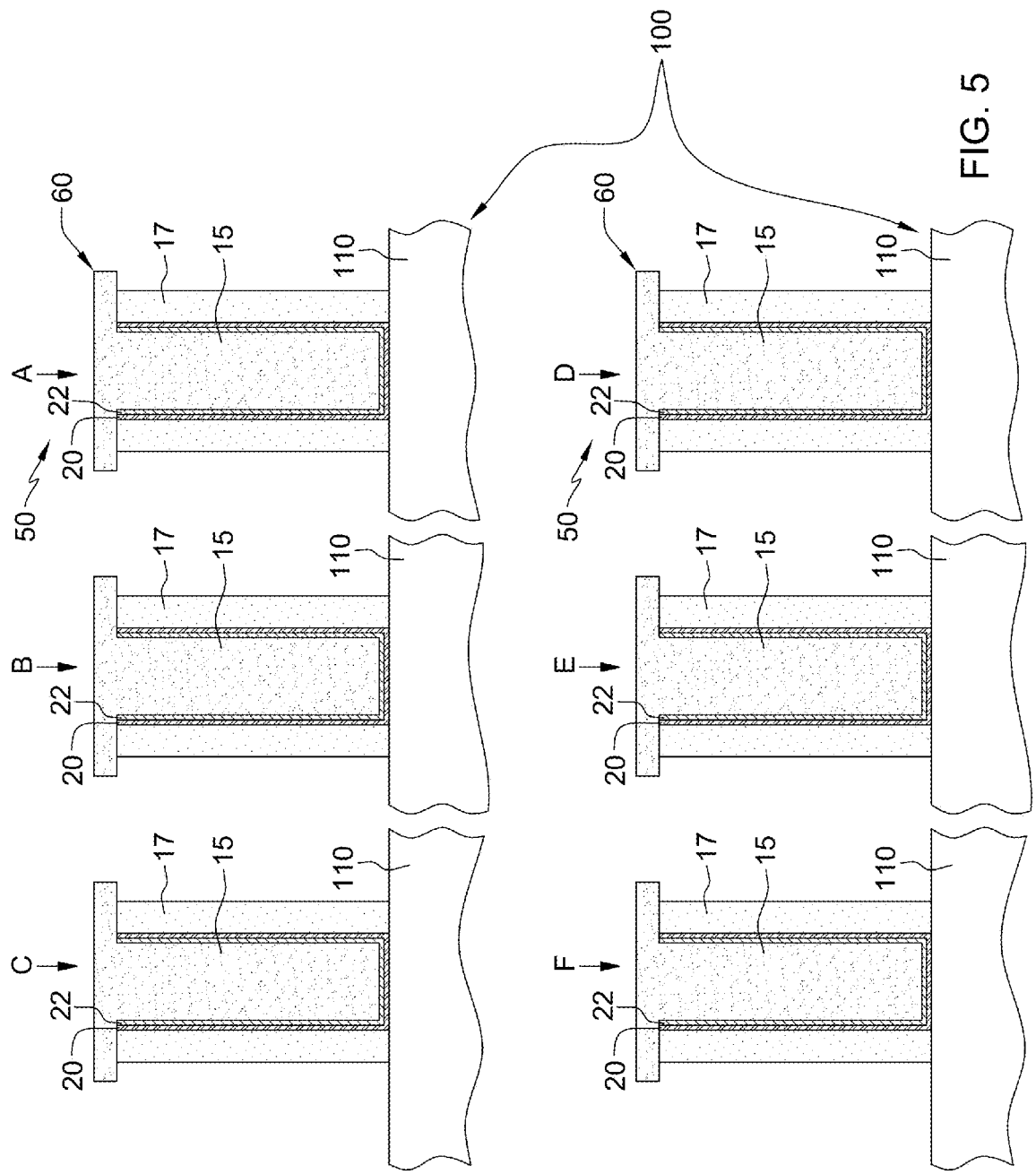
FIGS. 5-9 are partial fabrication cross sectional gate lengthwise side views taken along lines A-A and lines B-B of FIG. 3.

Referring to FIG. 5 there is shown a semiconductor device 100 in a partial state of fabrication. In the embodiment of FIG. 5, there are shown six FETs 50 in a partial state of fabrication. Each FET 50 can be disposed in a specific region A B C D E F of semiconductor device 100. It will be seen that when fabrication is complete the FET 50 of each region A B C D E F can have a different gate stack configuration a b c d e f. In the embodiment of FIG. 5, for clarity it is presented that the regions A B C D E F having FETs including different gate stack configurations can be adjacent regions. It will be understood that regions, e.g. regions A B C D E F having FETs 50 with different gate stack configurations a b c d e f can be non-adjacent regions, or can include a combination of adjacent and non-adjacent regions. In one embodiment, as shown in FIG. 5, FETs 50 of regions A B C can be configured as pFETs and FETs 50 of regions D E F can be configured as nFETs. In one embodiment, methods as set forth herein can be performed as part of a "gate last" fabrication process. In one embodiment, as shown in FIG. 5, partially fabricated FETs 50 in the state of partial fabrication shown in FIG. 5, can include sacrificial polysilicon gates for removal in a later fabrication stage. In another embodiment, differentiated gate stack configurations herein can be provided using a "gate first" fabrication process.

Figure 6:
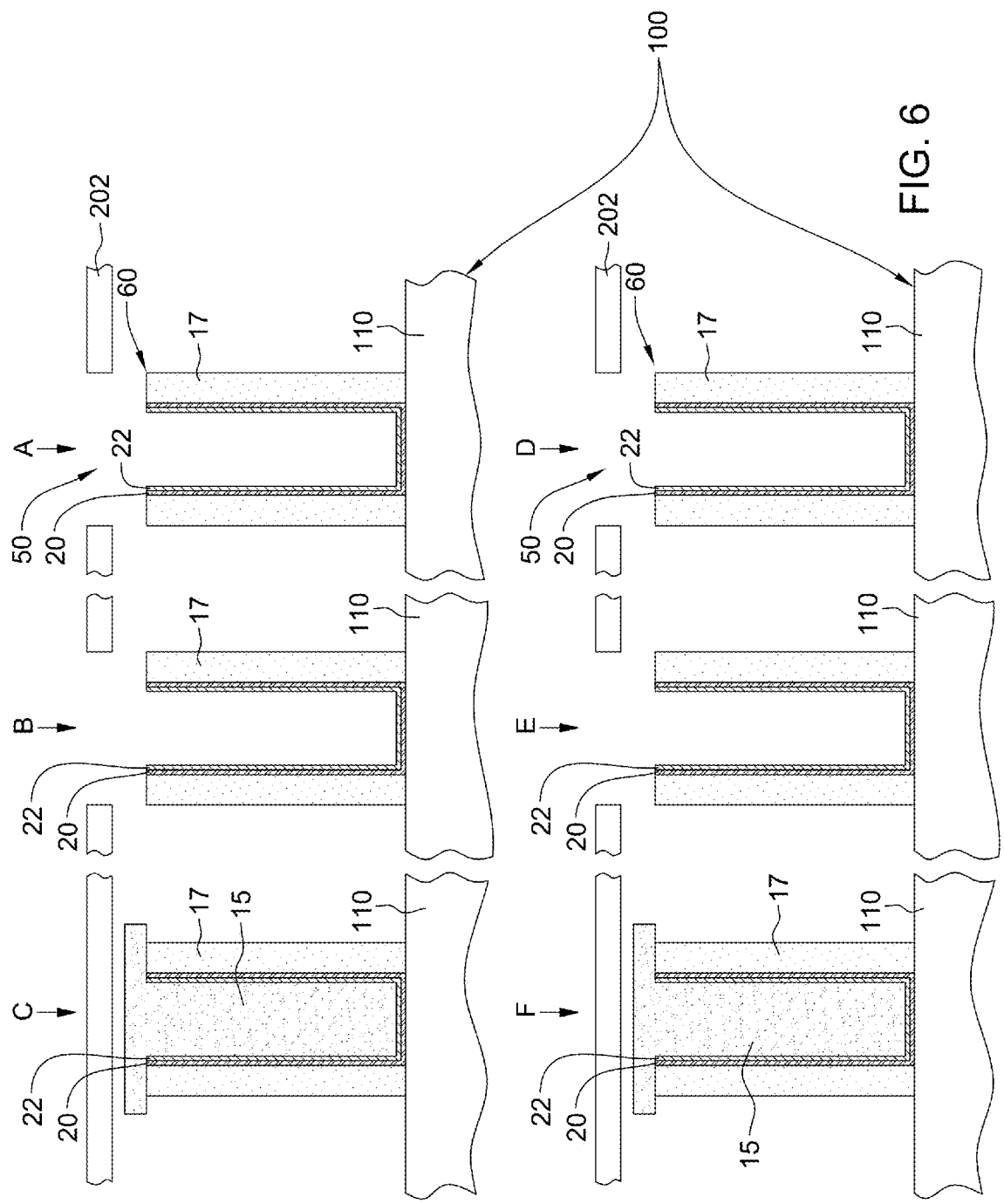

Referring to FIG. 6, a mask 202 can be applied over semiconductor device 100 in the partial fabrication stage shown in FIG. 5 and can cover intermediate fabrication stage FETs 50 of regions C and F. With mask 202 applied, polysilicon gates 15 can be removed from regions A B D and E.

Figure 7:
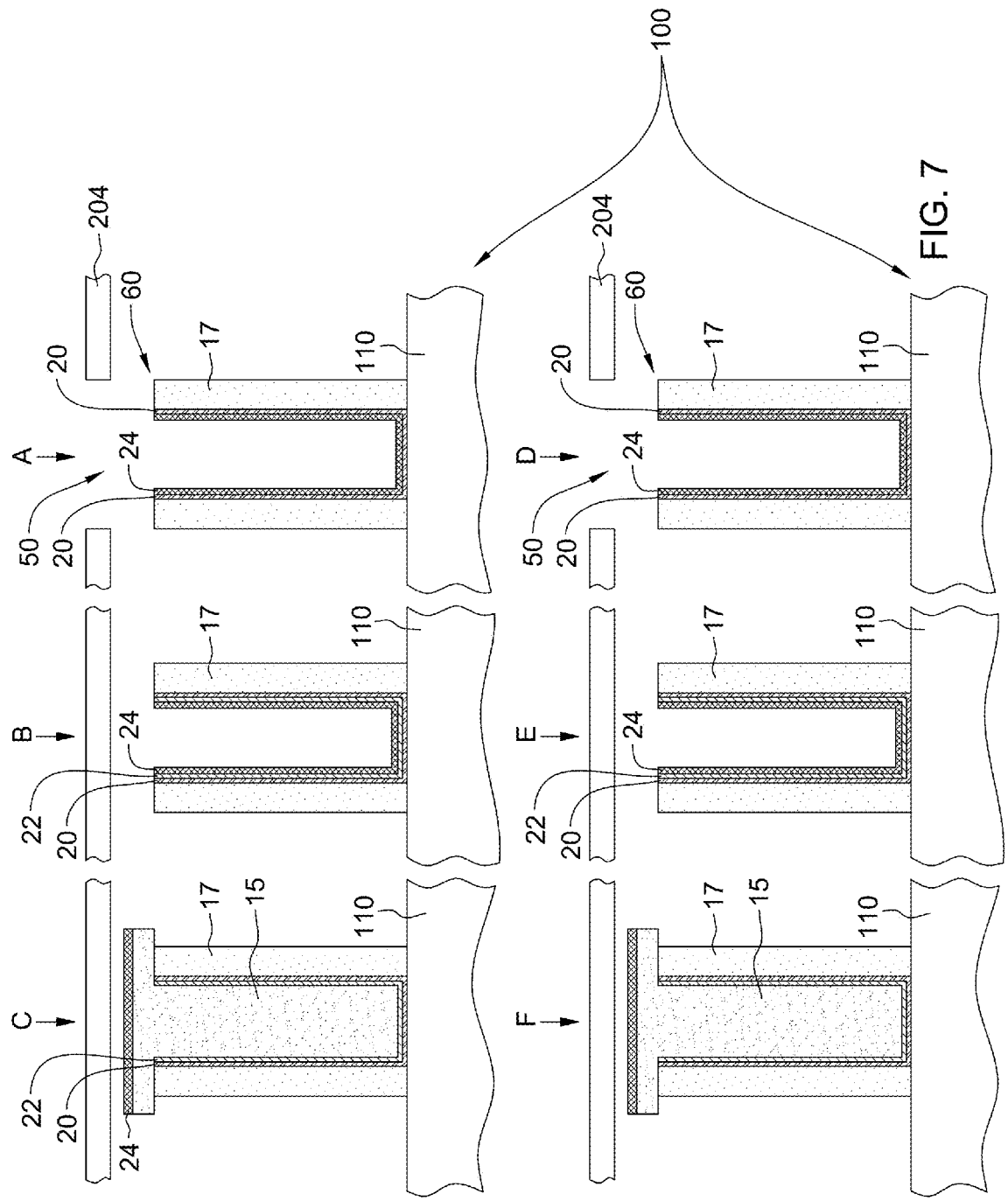

Referring to FIG. 7, a mask 204 can be applied over semiconductor device 100 when in the partial fabrication stage as shown in FIG. 6 and can cover regions B C E and F leaving regions A and D exposed. With mask 204 applied, conductive layer 22 can be removed from regions A and D. With mask 204 removed, conductive layer 24 can be deposited in the gate area of each of the regions AB C D E and F. For depositing of conductive layer 24 a variety of deposition processes can be utilized.

Figure 8:
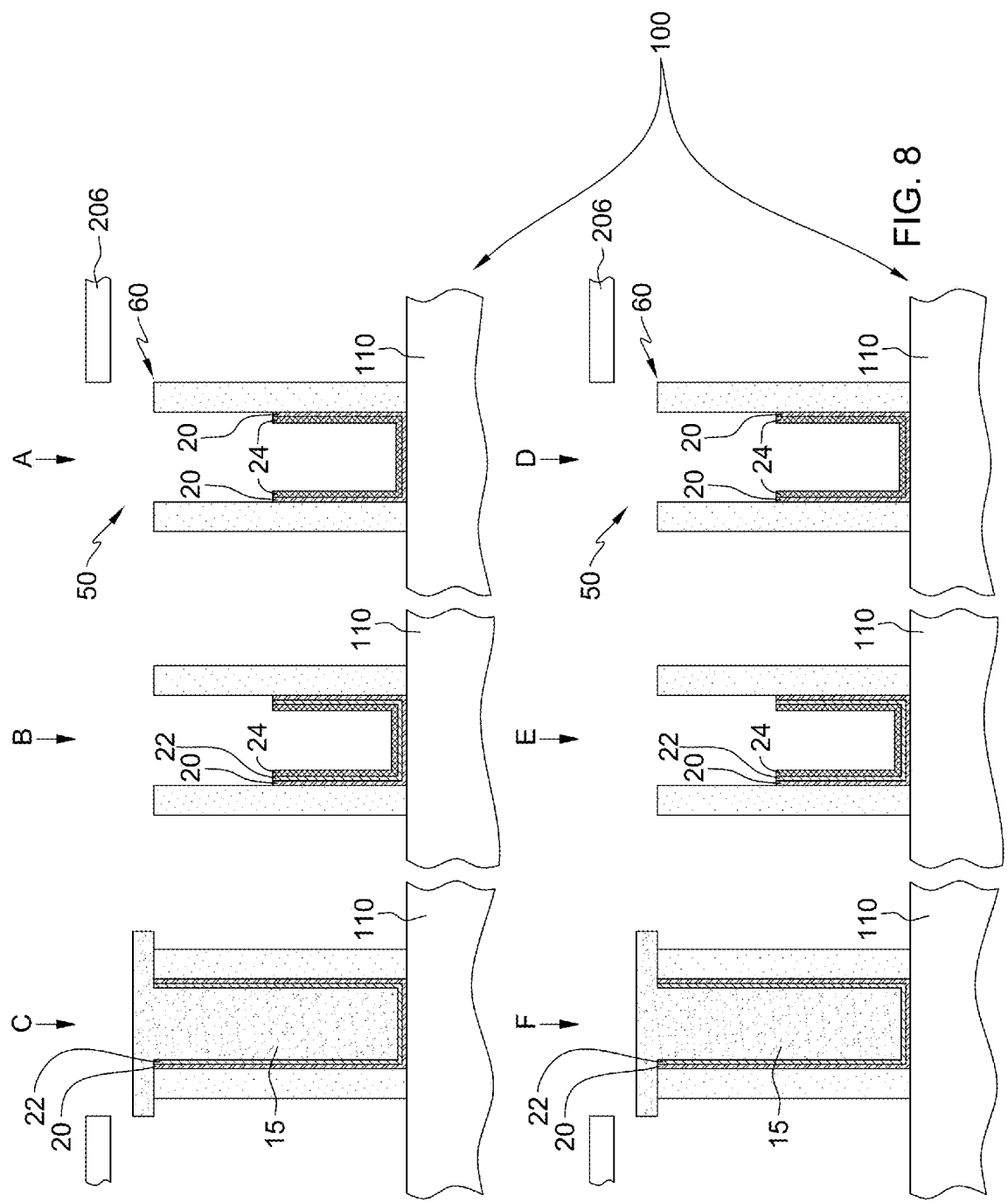
Figure 9:
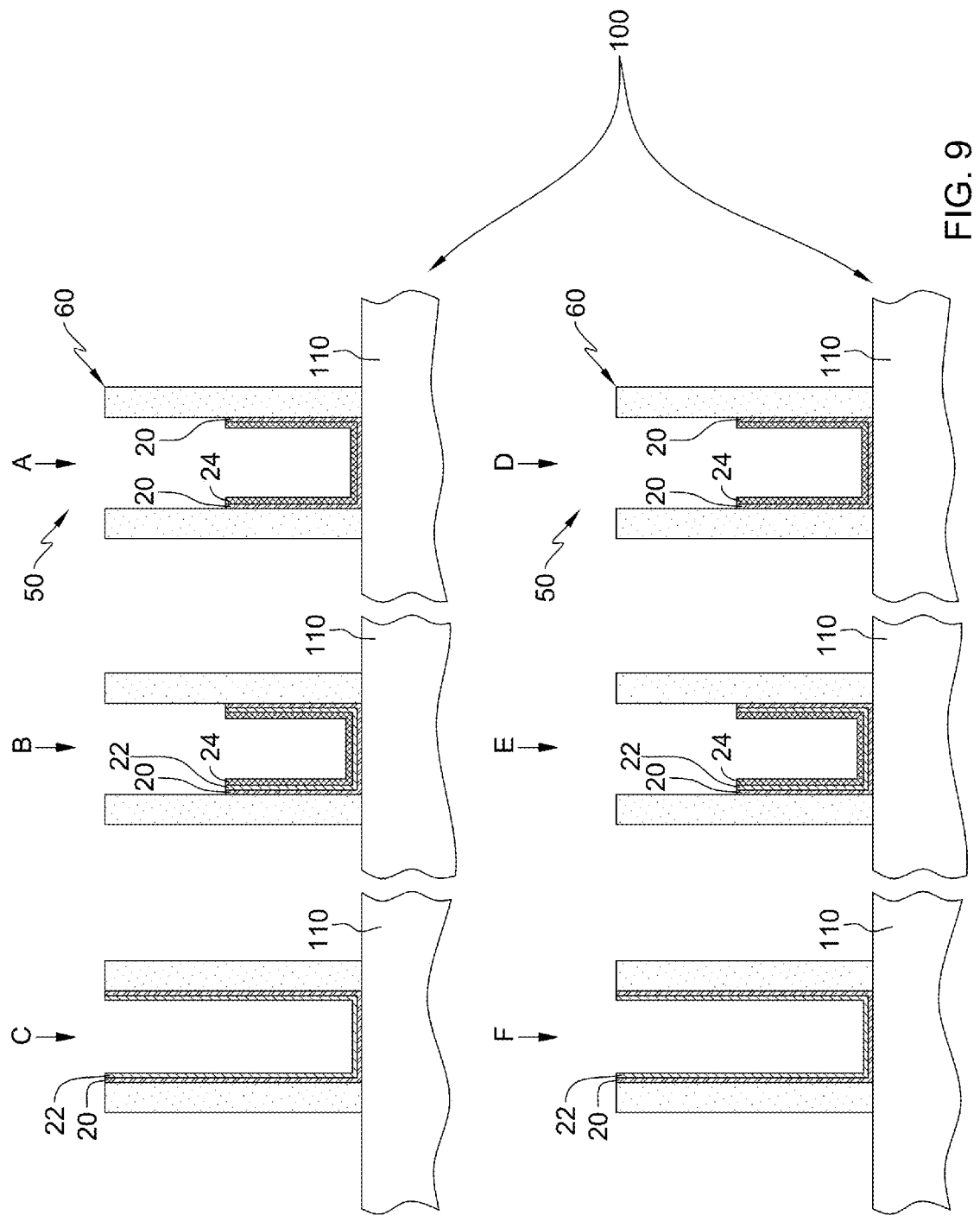

Referring to FIG. 8, the gate areas of each of regions A B C D E F can be subject to chamfering to reduce an elevation of layer 22 (if present) and layer 24 in regions A B D and E. With chamfering complete, conductive layer 24 of regions A B D and E and conductive layer 22 of regions B and E can have resulting elevations of about half the height of spacers 15 in one embodiment. In one embodiment, regions A B C D E F can be short channel regions of semiconductor device 100 and semiconductor device 100 can have regions other than short channel regions. In such embodiment, mask 206 can be provided to cover regions of semiconductor device 100 other than short channel regions.

Referring to. 9, semiconductor device 100 as shown in the partial fabrication stage of 8 can be subject to processing for removal of polysilicon gate 15 from region C and region F. Because an etch rate of polysilicon material of polysilicon gate 15 can be faster than an etch rate of highest elevation layers of regions A B D and E, masking may not be needed for selective removal of polysilicon gate 15 of region C and F as set forth in FIG. 9.

It has been highlighted that regions A B C can be designated as pFET regions of semiconductor device 100 and that regions D E F can be designated as nFET regions of semiconductor device 100. It can be seen that in the intermediate fabrication stage of FIG. 9 pFET region A can be in common with nFET region D, that pFET region B can be in common with nFET region E, and that pFET region C can be in common with nFET region F. Gate stack configuration differentiation between pFET and nFET regions can be provided in later fabrication stages.

Figure 10:
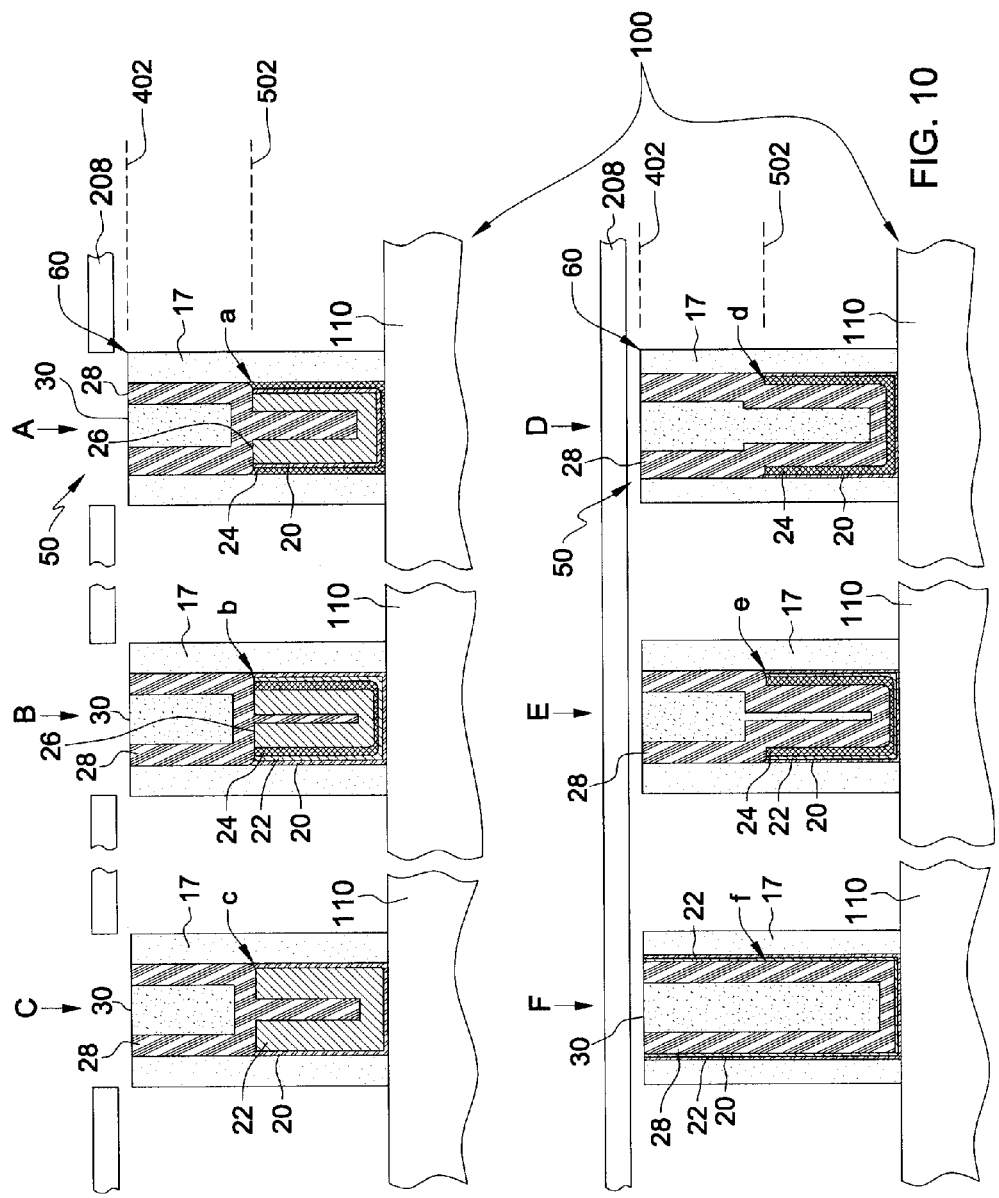
FIG. 10 is a cross sectional gate lengthwise side view according to one embodiment taken along lines A-A and lines B-B of FIG. 3.

Fabrication of a first exemplary set of differentiated pFET and nFET gate stack configurations a b c d e and f is set forth in reference to FIG. 10. Referring to the embodiment of FIG. 10, a mask 208 can be applied to cover regions D E F wherein the mask 208 includes apertures leaving regions A B C exposed. With mask 208 applied, conductive layer 26 can be deposited to an elevation of layer 22 and layer 24 selectively within the gate areas of region. An elevation of conductive layer 26 can be adjusted by overfilling conductive layer 26 and chamfering to remove excess material of conductive layer 26. With mask 208 subsequently removed conductive layer 28 can be deposited within a gate area of regions A B C D E F. Filler conductive layer 30 can then be deposited within a gate area of regions A B C D E F.

Referring to the embodiment of FIG. 10, FET 50 of region A can be a pFET having a regular voltage threshold, Vt (RVT), FET 50 of region B can be a pFET having a low voltage threshold, Vt (LVT), FET 50 of region C can be a pFET having a super low voltage threshold, Vt (SLVT), FET 50 of region D can be an nFET having a low voltage threshold, Vt (LVT), FET 50 of region E can be an nFET having a regular voltage threshold, Vt (RVT), FET 50 of region F can be an nFET having a super low voltage threshold, Vt (SLVT).

A work function of a gate can be expected to be affected more substantially by conductive layers closest to a channel region of fin 104 than by conductive layers a larger distance from a channel region of fin 104 (the region of fin 104 most proximate gate 60). In the development of apparatus and methods herein it was determined that TiN is a p material. As such, it was determined that for pFETs larger depositions of TiN proximate a channel region can be provided to yield smaller work functions. Accordingly, SLVT pFET FETs 50 can be provided by including relatively thick layers of TiN closer to a channel region. In the development of apparatus and methods herein it was determined that TiC is an n material. As such, it was determined that for nFETs, larger depositions of TiC proximate a channel region can be provided to yield smaller work functions. Accordingly, SLVT nFET FETs 50 can be provided by including relatively thick layers of TiC closer to a channel region.

A summary of layers in the embodiment of FIG. 10 is set forth in Table A.

TABLE A

| Region | C | B | A | F | E | D |
|---|---|---|---|---|---|---|
| Vt level and channel doping | SLVTP | LVTP | RVTP | SLVTN | RVTN | LVTN |
| Dielectric layer 20 | HK 10-20Å, T = T(L20)$_1$ | HK 10-20Å, T = T(L20)$_1$ | HK 10-20Å, T = T(L20)$_1$ | HK 10-20Å, T = T(L20)$_1$ | HK 10-20Å, T = T(L20)$_1$ | HK 10-20Å, T = T(L20)$_1$ |
| Layer 22 | TiN 40-60Å, T = T(L22)$_2$ | TiN 8-12Å, T = T(L22)$_1$ | absent | TiN 4-6Å, T = T(L22)$_3$ | TiN 8-12Å, T = T(L22)$_1$ | absent |
| Layer 24 | absent | TaN 6-8Å, T = T(L24)$_1$ | TaN 6-8Å, T = T(L24)$_1$ | absent | TaN 6-8Å, T = T(L24)$_1$ | TaN 6-8Å, T = T(L24)$_1$ |
| Conductive layer 26 | absent | TiN 30-50Å, T = T(L26)$_1$ | TiN 30-50Å, T = T(L26)$_1$ | absent | absent | absent |
| Layer 28 | TiC 30-50Å, T = T(L28)$_1$ | TiC 30-50Å, T = T(L28)$_1$ | TiC 30-50Å, T = T(L28)$_1$ | TiC 30-50Å, T = T(L28)$_1$ | TiC 40-60Å, T = T(L28)$_2$ | TiC 30-50Å, T = T(L28)$_1$ |
| Layer 30 | W | W | W | W | W | W |

Layer 28 represented in FIG. 10 and Table A as a single layer can include a primary TiC layer and lower and upper buffer layers. The lower and upper buffer layers can include, e.g. a 5 Å lower TiN buffer layer and a 10 Å upper TiN buffer layer.

Figure 11:
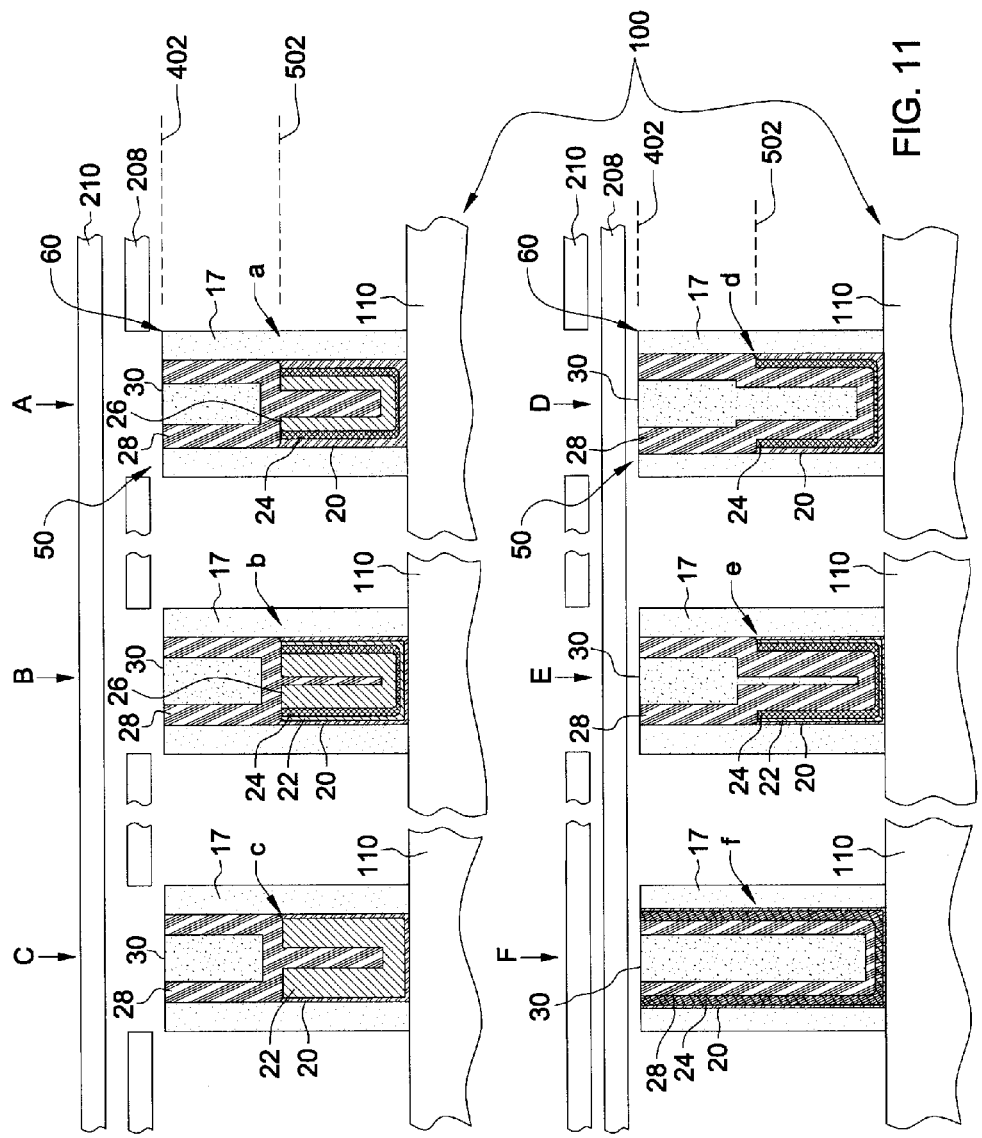
FIG. 11 is a cross sectional gate lengthwise side view according to one embodiment taken along lines A-A and lines B-B of FIG. 3.

Fabrication of a second exemplary set of differentiated pFET and nFET gate stack configurations ab c de and f is set forth in reference to FIG. 11. Referring to the embodiment of FIG. 11, a mask 208 can be applied to cover regions D E F wherein the mask 208 includes apertures leaving regions A B C exposed. With mask 208 applied, conductive layer 26 can be deposited to an conductive of layer 22 and layer 24 selectively within the gate areas of region in the manner set forth in reference to FIG. 10. An elevation of conductive layer 26 can be adjusted by overfilling conductive layer 26 and chamfering to remove excess material of conductive layer 26 With mask 208 subsequently removed, mask 210 can be applied which cover regions A B C and F and has apertures such that regions D and E are exposed. With mask 210 applied, a sublayer of conductive layer 24 is deposited in region D and E to increase a thickness of conductive layer 24 in region D and region E. With mask 210 subsequently removed, conductive layer 28 can be deposited within a gate area of regions A B C D E F. Filler conductive layer 30 can then be deposited within a gate area of regions A B C D E F.

Referring to the embodiment of FIG. 11, FET 50 of region A can be a pFET having a regular voltage threshold, Vt (RVT), FET 50 of region B can be a pFET having a low voltage threshold, Vt (LVT), FET 50 of region C can be a pFET having a super low voltage threshold, Vt (SLVT), FET 50 of region D can be an nFET having a low voltage threshold, Vt (LVT), FET 50 of region E can be an nFET having a regular voltage threshold, Vt (RVT), FET 50 of region F can be an nFET having a super low voltage threshold, Vt (SLVT).

A summary of layers in the embodiment of FIG. 11 is set forth in Table B.

TABLE B

| Region | C | B | A | F | E | D |
|---|---|---|---|---|---|---|
| Vt level and channel doping | SLVTP | LVTP | RVTP | SLVTN | RVTN | LVTN |
| Dielectric layer 20 | HK 10-20Å, T = T(L20)$_1$ | HK 10-20Å, T = T(L20)$_1$ | HK 10-20Å, T = T(L20)$_1$ | HK 10-20Å, T = T(L20)$_1$ | HK 10-20Å, T = T(L20)$_1$ | HK 10-20Å, T = T(L20)$_1$ |
| Layer 22 | TiN 40-60Å, T = T(L22)$_2$ | TiN 8-12Å, T = T(L22)$_1$ | absent | absent | TiN 8-12Å, T = T(L22)$_1$ | absent |
| Layer 24 | absent | TaN 6-8Å, T = T(L24)$_1$ | TaN 6-8Å, T = T(L24)$_1$ | TaN 4-6Å, T = T(L24)$_1$ | TaN 10-14Å, T = T(L24)$_2$ | TaN 10-14Å, T = T(L24)$_2$ |
| Conductive layer 26 | absent | TiN 30-50Å, T = T(L26)$_1$ | TiN 30-50Å, T = T(L26)$_1$ | absent | absent | absent |
| Layer 28 | TiC 40-60Å, T = T(L28)$_1$ | TiC 40-60Å, T = T(L28)$_1$ | TiC 40-60Å, T = T(L28)$_1$ | TiC 40-60Å, T = T(L28)$_1$ | TiC 40-60Å, T = T(L28)$_1$ | TiC 40-60Å, T = T(L28)$_1$ |
| Layer 30 | W | W | W | W | W | W |

Layer 28 represented in FIG. 11 and Table B as a single layer can include a primary TiC layer and lower and upper buffer layers. The lower and upper buffer layers can include, e.g. a 5 Å lower TiN buffer layer and a 10 Å upper TiN buffer layer.

Fabrication of a third exemplary set of differentiated pFET and nFET gate stack configurations a b c d e and f is set forth in reference to FIG. 12. Referring to the embodiment of FIG. 12, a mask 212 can be applied to cover regions D E F wherein the mask 212 includes apertures leaving regions A B C exposed. With mask 208 applied, conductive layer 27 can be deposited to an elevation of layer 22 and layer 24 selectively within the gate areas of region. As elevation of layer 27 can be adjusted by overfilling of layer 27 and chamfering to remove excess material of layer 27. With mask 208 subsequently removed conductive layer 29 can be deposited within a gate area of regions A B C D E F. Filler conductive layer 30 can then be deposited within a gate area of regions A B C D E F.

Referring to the embodiment of FIG. 10, FET 50 of region A can be a pFET having a regular voltage threshold, Vt (RVT), FET 50 of region B can be a pFET having a low voltage threshold, Vt (LVT), FET 50 of region C can be a pFET having a super low voltage threshold, Vt (SLVT), FET 50 of region D can be an nFET having a low voltage threshold, Vt (LVT), FET 50 of region E can be an nFET having a regular voltage threshold, Vt (RVT), FET 50 of region F can be an nFET having a super low voltage threshold, Vt (SLVT).

A summary of layers in the embodiment of FIG. 12 is set forth in Table C.

TABLE C

| Region | C | B | A | F | E | D |
|---|---|---|---|---|---|---|
| Vt level and channel doping | SLVTP | RVTP | LVTP | SLVTN | LVTN | RVTN |
| Dielectric layer 20 | HK 10-20Å, $T = T(L20)_1$ | HK 10-20Å, $T = T(L20)_1$ | HK 10-20Å, $T = T(L20)_1$ | HK 10-20Å, $T = T(L20)_1$ | HK 10-20Å, $T = T(L20)_1$ | HK 10-20Å, $T = T(L20)_1$ |
| Layer 22 | TiN 40-60Å, $T = T(L22)_2$ | TiN 8-12Å, $T = T(L22)_1$ | absent | TiN 8-12Å, $T = T(L22)_1$ | TiN 8-12Å, $T = T(L22)_1$ | absent |
| Layer 24 | absent | TaN 6-8Å, $T = T(L24)_1$ | TaN 6-8Å, $T = T(L24)_1$ | absent | TaN 6-8Å, $T = T(L24)_1$ | TaN 6-8Å, $T = T(L24)_1$ |
| Layer 27 | absent | absent | absent | TiC 40-60Å, $T = T(L27)_1$ | TiC 40-60Å, $T = T(L27)_1$ | TiC 40-60Å, $T = T(L27)_1$ |
| Layer 29 | absent | TiN 30-50Å, $T = T(L29)_1$ | TiN 30-50Å, $T = T(L29)_1$ | TiN 30-50Å, $T = T(L29)_1$ | TiN 30-50Å, $T = T(L29)_1$ | TiN 30-50Å, $T = T(L29)_1$ |
| Layer 30 | W | W | W | W | W | W |

Layer 24 represented in FIG. 12 and Table C as a single layer can include an upper buffer layer, e.g. a 10 Å upper buffer layer.

Each of dielectric layer 20, conductive layer 22, conductive layer 24, conductive layer 26, conductive layer 27 conductive layer 28 conductive layer 29 and filler conductive layer 30 can be deposited using any of a variety of deposition processes, including, for example, physical vapor deposition (PVD), atomic layer deposition (ALD), chemical vapor deposition (CVD), sputtering, or other known processes, depending on the material composition of the layer.

In one example, protective masks 202, 204, 206, 208, 210, 212 as set forth herein may include a material such as, for example, silicon nitride, silicon oxide, or silicon oxynitride, and may be deposited using conventional deposition processes, such as, for example, CVD or plasma-enhanced CVD (PECVD). In other examples, other mask materials may be used depending upon the materials used in semiconductor device 100. For instance, a protective mask 202, 204, 206, 208, 210, 212 may be or include an organic material. For instance, flowable oxide such as, for example, a hydrogen silsesquioxane polymer, or a carbon-free silsesquioxane polymer, may be deposited by flowable chemical vapor deposition (F-CVD). In another example, a protective mask 202, 204, 206, 208, 210, 212 may be or include an organic polymer, for example, polyacrylate resin, epoxy resin, phenol resin, polyamide resin, polyimide resin, unsaturated polyester resin, polyphenylene ether resin, polyphenylenesulfide resin or benzocyclobutene (BCB).

Removing sacrificial polysilicon gate 15 and conductive layers 22, 24 as set forth herein can be achieved by any suitable etching process, such as dry or wet etching processing. In one example, isotropic dry etching may be used by, for example, ion beam etching, plasma etching or isotropic RIE. In another example, isotropic wet etching may also be performed using etching solutions selective to the material subject to removal.

In reference to the embodiments of FIGS. 10, 11, and 12 and Tables A B and C, it can be seen that a gate can include a gate elevation 402 which can be defined by an elevation of spacers 17, whereas various gate layers can have an elevation 502 of less than an elevation 402 of gate 60. It can be seen that a certain gate layer extending to a gate elevation 402 in a first gate stack configuration can extend to an elevation 502 less than a gate elevation 502 in a second gate configuration. As set forth herein, chamfering can be employed for reducing an elevation of one or more gate layer.

In one embodiment in accordance with the embodiments of FIGS. 10, 11 and 12 and Tables A B and C, a well doping configuration WD and a halos doping configuration HD can be maintained constant for each pFET region A B and C. Further, a well doping configuration WD and a halos doping configuration HD can be maintained constant for each nFET region C D and E. Each of the pFET regions A B and C can include a common well doping configuration WD and a common halos doping configuration HD. Each of the nFET regions D E F can include a common well doping configuration WD and a common halos doping configuration HD. In one embodiment according to Tables A B and C threshold voltage can be tuned by varying gate stack configurations between the regions without varying either well doping or halos doping throughout the regions. In one embodiment according to Tables A B and C threshold voltage can be tuned by varying gate stack configurations between the regions without varying any process variable other than the gate stack configuration. Tuning of threshold voltage Vt without varying of doping of a substrate structure can eliminate or reduce implant induced device performance degradation and variability of semiconductor device 100.

Referring to the embodiments of FIGS. 10 11 and 12, and Tables A B and C, it is seen that FETs 50 of a common (n or p) channel polarity of different regions of a semiconductor device 100 can have different gate stack configurations and different threshold voltages. A first region can include a FET 50 having a first gate stack configuration and a super low threshold voltage (SLVT), a second region can include a FET 50 having a second gate stack configuration and a low threshold voltage (LVT), a third region can include a FET 50 having a third gate stack configuration and a regular threshold voltage (RVT). In one embodiment a voltage difference between an SLVT threshold voltage and an LVT threshold voltage of FETs 50 having different gate stack configurations formed in different regions of semiconductor device 100 having a common channel polarity can be at least 10 mv. In one embodiment such voltage difference can be at least 20 mv. In one embodiment such voltage difference can be at least 30 mv. In one embodiment such voltage difference can be at least 40 mv. In one embodiment such voltage difference can be at least 50 mv. In one embodiment such voltage difference can be at least 60 mv. In one embodiment such voltage difference can be at least 70 mv. In one embodiment such voltage difference can be at least 80 mv. In one embodiment such voltage difference can be at least 90 mv. In one embodiment such voltage difference can be at least 1000 mv. In one embodiment a voltage difference between an LVT threshold voltage and an RLVT threshold voltage of FETs 50 having different gate stack configurations formed in different regions of semiconductor device 100 having a common channel polarity is at least 10 mv. In one embodiment such voltage difference can be at least 20 mv. In one embodiment such voltage difference can be at least 30 mv. In one embodiment such voltage difference can be at least 40 mv. In one embodiment such voltage difference can be at least 50 mv. In one embodiment such voltage difference can be at least 60 mv. In one embodiment such voltage difference can be at least 70 mv. In one embodiment such voltage difference can be at least 80 mv. In one embodiment such voltage difference can be at least 90 mv. In one embodiment such voltage difference can be at least 1000 mv.

Referring to the embodiments of FIGS. 10 11 and 12, and Tables A, B and C, a gate length of a FET 50 of each region A B C D E F can be a short channel region gate length in one embodiment. Referring to the embodiments of FIGS. 10 11 and 12, and Tables A B and C, a gate length of a FET 50 of each region A B C D E F can be a common gate length in one embodiment (a FET 50 of each region has a gate length in common with a gate length of FETs 50 of the remaining regions of semiconductor device 100). In one embodiment, semiconductor device 100 can be configured so that each region A B C D E F having a FET 50 with a certain gate stack configuration a b c de f can be provided a plurality of times (e.g. more than one time, tens of times, hundreds of times, thousands of times, millions of times, billions of times) throughout semiconductor device 100.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises," "has," "includes," or "contains" one or more steps or elements possesses those one or more steps or elements, but is not limited to possessing only those one or more steps or elements. Likewise, a step of a method or an element of a device that "comprises," "has," "includes," or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A semiconductor device comprising:
   a substrate structure;
   a first field effect transistor formed in the substrate structure, a second field effect transistor formed in the substrate structure, and a third field effect transistor formed in the substrate structure, wherein each of the first field effect transistor, the second field effect transistor and the third field effect transistor have a first common channel polarity;
   a fourth field effect transistor formed in the substrate structure, a fifth field effect transistor formed in the substrate structure, and a sixth field effect transistor formed in the substrate structure, wherein each of the fourth field effect transistor, the fifth field effect transistor and the sixth field effect transistor have a second common channel polarity;
   wherein the first field effect transistor includes a first gate stack configuration and wherein the first field effect transistor is configured to have a first threshold voltage;
   wherein the second field effect transistor includes a second gate stack configuration and wherein the second field effect transistor is configured to have a second threshold voltage higher than the first threshold voltage;
   wherein the third field effect transistor includes a third gate stack configuration and wherein the third field effect transistor is configured to have a third threshold voltage higher than the second threshold voltage;
   wherein the fourth field effect transistor includes a fourth gate stack configuration and wherein the fourth field effect transistor is configured to have a fourth threshold voltage;
   wherein the fifth field effect transistor includes a fifth gate stack configuration and wherein the fifth field effect transistor is configured to have a fifth threshold voltage higher than the fourth threshold voltage, the fifth gate stack comprising a dielectric layer, a first conductive layer overlying the dielectric layer, a second conductive layer overlying the first conductive layer, a third conductive layer overlying the second conductive layer, a fourth conductive layer overlying the third conductive layer, and a filler conductive layer overlying the fourth conductive layer;
   wherein the sixth field effect transistor includes a sixth gate stack configuration and wherein the sixth-field effect transistor is configured to have a sixth threshold voltage higher than the fifth threshold voltage, the sixth gate stack comprising the fifth gate stack absent the first conductive layer;
   wherein the first gate stack comprises the fifth gate stack absent one of the third and the first conductive layers and the third and the second conductive layers;
   wherein the second gate stack comprises the fifth gate stack absent the first and the third conductive layers;
   wherein the third gate stack comprises the fifth gate stack absent the third conductive layer; and
   wherein the fourth gate stack comprises the fifth gate stack absent the second and the third conductive layers.

2. The semiconductor device of claim 1, wherein the first common channel polarity is an n channel polarity, wherein the first gate stack configuration includes a first n material layer of a first thickness, and wherein the third gate stack configuration includes the first n material layer of a second thickness, the second thickness greater than the first thickness.

3. The semiconductor device of claim 1, wherein the second common channel polarity is a p channel polarity, wherein the fourth gate stack configuration includes a first p material layer of a first thickness, and wherein the fifth gate stack configuration includes the first p material layer of a second thickness, the second thickness less than the first thickness.

4. The semiconductor device of claim 1, wherein the third gate stack configuration includes a gate elevation, and wherein the third gate stack configuration includes a first conductive layer extending to an elevation of less than the gate elevation.

5. The semiconductor device of claim 1, wherein the third gate stack configuration includes a gate elevation, and wherein the third gate stack configuration includes a first conductive layer extending to an elevation of about one half of the gate elevation.

6. The semiconductor device of claim 1, wherein the third gate stack configuration includes a gate elevation, and wherein the third gate stack configuration includes first and second conductive layers extending to an elevation of less than the gate elevation.

7. The semiconductor device of claim 1, wherein the first field effect transistor, second filed effect transistor, and third field effect transistor have short channel region gate lengths.

8. The semiconductor device of claim 1, wherein a lowest elevation conductive layer of the first gate stack configuration includes a first material, and wherein a lowest elevation conductive layer of the second gate stack configuration includes a second material different from the first material.

9. The semiconductor device of claim 1, wherein a lowest elevation conductive layer of the first gate stack configuration includes a first material of a first thickness, and wherein a lowest elevation conductive layer of the second gate stack configuration includes the first material of a second thickness different from the first thickness.

10. The semiconductor device of claim 1, wherein a lowest elevation conductive layer of the first gate stack configuration includes a first thickness, and wherein a lowest elevation conductive layer of the second gate stack configuration includes a second thickness different from the first thickness.

11. The semiconductor device of claim 1, wherein the semiconductor device includes a first plurality of field effect transistors having the first gate stack configuration, a second plurality of field effect transistors having the second gate stack configuration, and a third plurality of field effect transistors having the third gate stack configuration, wherein field effect transistors of the first plurality of transistors have the first threshold voltage, wherein field effect transistors of the second plurality of transistors have the second threshold voltage, and wherein field effect transistors of the third plurality of transistors have the third threshold voltage.

12. The semiconductor device of claim 11, wherein field effect transistors of the first plurality of field effect transistors, field effect transistors of the second plurality of field effect transistors, and field effect transistors of the third plurality of field effect transistors have a common gate length.

\* \* \* \* \*